United States Patent [19]

Wells et al.

[11] Patent Number: 5,490,264

[45] Date of Patent: Feb. 6, 1996

[54] GENERALLY-DIAGONAL MAPPING OF ADDRESS SPACE FOR ROW/COLUMN ORGANIZER MEMORIES

[75] Inventors: Steven Wells, Citrus Heights; Mark Winston, El Dorado Hills, both of Calif.

[73] Assignee: Intel Corporation, Santa Clara, Calif.

[21] Appl. No.: 130,023

[22] Filed: Sep. 30, 1993

[51] Int. Cl.$^6$ .................................................. G06F 12/00
[52] U.S. Cl. ...................... 395/481; 395/427; 395/421.07; 395/421.1
[58] Field of Search .................................. 395/481, 427, 395/430, 410, 421.07, 421.1

[56] References Cited

U.S. PATENT DOCUMENTS

| | | | |
|---|---|---|---|
| 4,642,759 | 2/1987 | Foster | 395/500 |
| 4,644,494 | 2/1987 | Muller | 395/479 |
| 4,763,305 | 8/1988 | Kuo | 365/185 |
| 4,896,262 | 1/1990 | Wayama et al. | 395/500 |
| 4,958,315 | 9/1990 | Balch | 395/500 |
| 5,047,989 | 9/1991 | Canepa et al. | 365/238.5 |
| 5,077,737 | 12/1991 | Leger et al. | 395/182.4 |
| 5,111,385 | 5/1992 | Hattori | 395/484 |
| 5,131,089 | 7/1992 | Cole | 395/500 |
| 5,199,033 | 3/1993 | McGeoch et al. | 395/182.05 |
| 5,200,959 | 4/1993 | Gross et al. | 371/21.6 |
| 5,224,070 | 6/1993 | Fandrich et al. | 365/185 |

FOREIGN PATENT DOCUMENTS

| | | |
|---|---|---|
| 2088442 | 1/1993 | Canada . |
| 0175458 | 3/1986 | European Pat. Off. . |
| 0392895 | 10/1990 | European Pat. Off. . |
| 2251324 | 7/1992 | United Kingdom . |
| 2251323 | 7/1992 | United Kingdom . |

*Primary Examiner*—David L. Robertson
*Attorney, Agent, or Firm*—Blakely, Sokoloff, Taylor & Zafman

[57] ABSTRACT

A method for storing data in a generally-diagonal pattern in blocks of a flash EEPROM array by which the least number of memory cells are affected by a failure of either a row conductor or a column conductor, and apparatus for addressing the flash array to produce such a generally-diagonal storage pattern. The arrangement allows the simplest forms of error detection and correction circuitry to be utilized.

22 Claims, 8 Drawing Sheets

```
        1 1 0 1   Parity 1
        1 1 1 1          0
        0 0 1 0          1
        1 0 0 0          1
Parity  1 0 0 0
```

GENERALLY-DIAGONAL MAPPING OF ADDRESS SPACE FOR ROW/COLUMN ORGANIZER MEMORIES

BACKGROUND OF THE INVENTION

1. Field of the Invention

This invention relates to computer memory arrays, and more particularly, to methods and apparatus for storing data in a memory array organized on a column and row basis in order to preserve the integrity of the data.

2. History of the Prior Art

Modern computer systems make extensive use of long term memory. Typically this memory is provided by one or more hard (fixed) disk drives. A hard disk drive is an electro-mechanical device which includes one or more flat circular disks fixed to rotate rapidly about a central axis. Each flat disk has opposite surfaces which are coated with some form of magnetic material. A mechanical arm driven by electrical signals places a magnetic head over each side of each disk to write to positions on the disk or to read from those positions. These positions lie in sectors, a number of which (e.g., seventeen) form one complete track on one side of a disk. Each sector is capable of storing a fixed number of bytes of data (typically 512 bytes). Depending on formatting, a single side of a disk may have over six hundred tracks. A typical electro-mechanical hard disk drive used in personal computers today is capable of storing forty megabytes of data.

Such hard disk drives are very useful and have become almost a necessity to the operation of personal computers. However, such electro-mechanical drives do have their drawbacks. They are relatively heavy and increase the weight of a computer, especially a portable computer, significantly. More importantly, electro-mechanical hard disk drives are very susceptible to shock. An electro-mechanical hard disk drive which is dropped is quite likely to cease functioning with a catastrophic loss of data.

Recently, forms of long term storage other than electro-mechanical hard disk drives have become feasible for use in computers. One of these is the flash electrically-erasable programmable read only memory (flash EEPROM) array. A flash EEPROM array is comprised of a large plurality of floating-gate field effect transistors arranged as memory cells in typical row and column fashion with circuitry for accessing the individual cells and placing the memory transistors of those cells in one of two memory conditions. A flash memory cell, like a typical EEPROM cell but in contrast to DRAM memory, retains information when power is removed. A flash EEPROM array has a number of characteristics which adapt it to use as long term memory. It is light in weight and occupies very little space. More importantly, it is especially rugged. It will withstand without adverse effects repeated drops each of which would destroy a typical electro-mechanical hard disk drive.

A difficulty with flash EEPROM, however, is that it is not reprogrammable until it has been erased, and the method by which this is accomplished requires that all of the transistors (cells) used in the memory be erased together by applying a high voltage simultaneously to the source terminals of all of the transistors in the memory array (or an electrically-isolated portion thereof). Although this is a very slow process, it has been found that a flash EEPROM array may be used for long term storage where data is rapidly changing by physically separating the flash array during chip layout into smaller groups (blocks) of cells which may be erased together. To reduce the need for erasure of the blocks, data is written to an empty position in any logical block of the flash memory array which has space available no matter what the sector address of the data or the physical address on the block. A lookup table is kept which records the physical position on the block of the logical sector address. This arrangement allows a first block to be written sector by sector, a second block to be written in the same sequential manner, and so on. When the data in a sector changes so that the sector needs to be rewritten, the data is written to a new physical position, the data in the lookup table is changed to record the new physical position against the logical sector number, and the first position at which the data was written is marked as dirty so that an attempt to read that physical position produces an error signal. After some period of time, a sufficient number of blocks will be filled that it will be desirable to release space by moving the valid information from some especially dirty block to some other block and erasing the entire block from which the valid information has been read. This array architecture reduces the amount of erasure necessary and allows a flash EEPROM array to function even faster than an electro-mechanical hard disk drive.

The details of the new arrangement are disclosed is U.S. patent application Ser. No. 07/969,131, entitled *A Method and Circuitry For A Solid State Memory Disk*, S. Wells, filed Oct. 31, 1992, and assigned to the assignee of the present invention. An especial advantage of the arrangement is that it allows the erasure of blocks to occur in the background when the facilities of the array are not otherwise occupied with reading and writing. In this manner, the external host which is writing to and receiving information from the flash array is typically not aware that an erasure is taking place even though the erasure requires one or two seconds. Another advantage of the arrangement is that the individual blocks of flash memory store sectors which may be of any size rather than the fixed size sectors stored by electro-mechanical hard disks. This cuts down substantially the amount of addressing required and essentially eliminates the lost space typical of hard and floppy disks with their fixed size sectors because each individual sector of data placed on a block of flash memory need only be as long as the data it stores.

However, an electro-mechanical hard disk drive memory offers certain advantages even though it has its drawbacks. For example, an electro-mechanical hard disk drive is typically able to utilize various error checking and correcting schemes which allow different types of errors to be corrected by storing certain error checking information with the data. However, an electro-mechanical hard disk drive is organized to read and write data serially in circular tracks of decreasing sizes surrounding a center. The row and column organization of flash memory does not lend itself to immediate use of such schemes. It is, therefore, desirable to provide new arrangements by which various error correcting schemes may be implemented to the greatest advantage.

Moreover, flash memory is subject to failures caused the methods by which it is addressed. More particularly, access to a block of flash EEPROM is provided by conductors (wordlines) which connect to all of the memory cells in a row and other conductors (bitlines) which connect to all of the memory cells in a column. Thus, failures in flash EEPROM may effect an entire row or an entire column of memory cells. It is also desirable to provide addressing arrangements by which the least amount of data will be lost in any given failure peculiar to the arrangement of flash EEPROM.

SUMMARY OF THE INVENTION

It is, therefore, an object of the present invention to provide an optimal addressing arrangement for flash EEPROM memory arrays.

It is another object of the present invention to provide an arrangement for addressing flash EEPROM in order that the least number of memory cells be affected by row and column failures.

It is an additional object of the present invention to provide an arrangement for addressing flash EEPROM in order that error correcting techniques may be easily applied to the data stored for detection and correction of errors.

These and other objects of the present invention are realized in a method for storing data in a generally-diagonal pattern in blocks of a flash EEPROM array by which the least number of memory cells are affected by a failure of either a row conductor or a column conductor, and apparatus for addressing the flash EEPROM array to produce such a generally-diagonal storage pattern.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
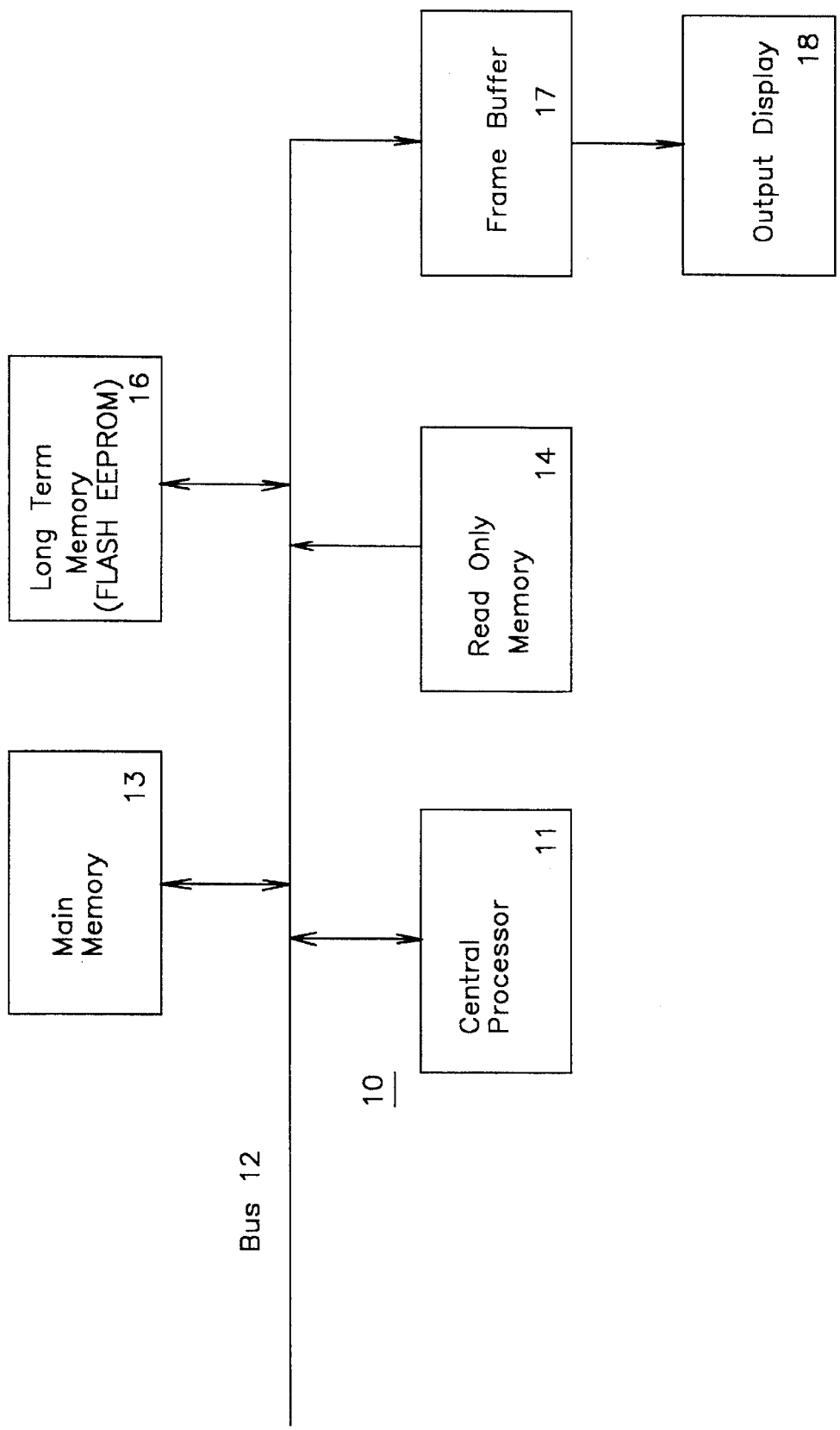
FIG. 1 is a block diagram of a computer system which may utilize a flash EEPROM array designed in accordance with the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. Typically, such flash EEPROM memory will include circuitry for programming and erasing the memory array. If the memory 14 is constructed of flash EEPROM memory cells, it may be modified by running an update process on the computer itself to reprogram the values stored in the memory 14.

Also connected to the bus 12 are various peripheral components such as long term memory 16 and circuitry such as a frame buffer 17 to which data may be written which is to be transferred to an output device such as a monitor 18 for display. The construction and operation of long term memory 16 (typically electro-mechanical hard disk drives) is well known to those skilled in the art. However, rather than the typical electro-mechanical hard disk drive, a flash EEPROM memory array may be used as the long term memory 16.

Figure 2:
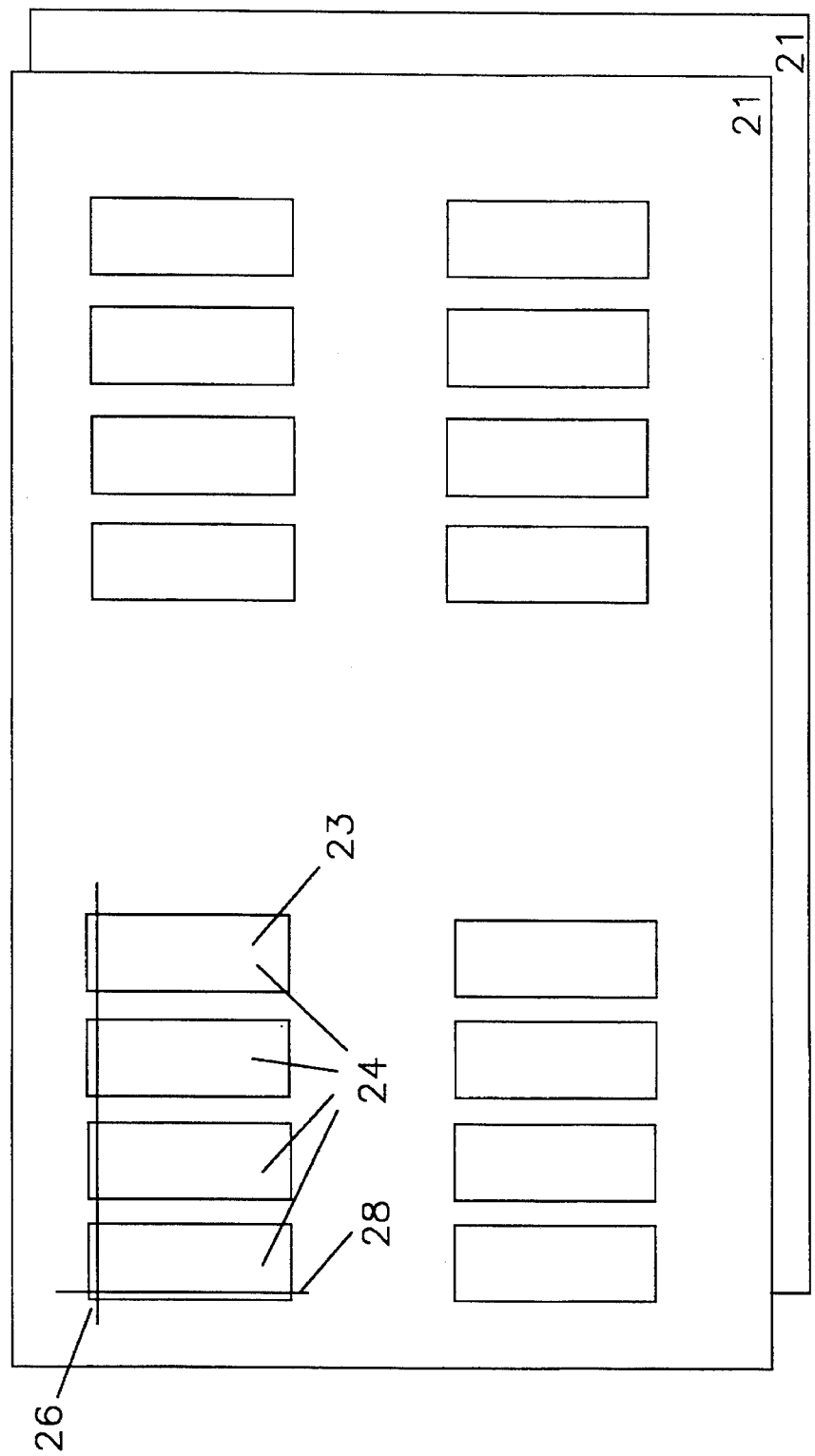
FIG. 2 is a diagram illustrating a flash EEPROM memory array including a plurality of blocks on a number of silicon substrates which may be used in the system of FIG. 1.

FIG. 2 illustrates a portion of a flash EEPROM array 14 which may be used in the computer system of FIG. 1. The flash EEPROM array 14 comprises a plurality (only two of which are illustrated) of silicon substrates (chips) 21 upon which are positioned individual floating gate field effect memory transistors. The memory transistors of each chip 21 are grouped in blocks 23 each of which may be erased independently of the other blocks on the chip 21. Typically, an array will consist of thirty such chips 21 each of which includes memory transistors positioned in sixteen individual blocks 23.

In the preferred embodiment, the sixteen blocks 23 of each chip 21 are actually sixteen subblocks. Each subblock is, in fact, physically paired with a subblock on another of the silicon chips 21 to create a logical block of the array in which odd bytes of data are stored on the subblock of one chip 21 and even bytes of data are stored on the subblock of the other chip 21. Then, each of the logical blocks of flash memory is connected to be separately erasable from all other such blocks. Each of the logical blocks of the array typically holds 128 kilobytes of data, sufficient to hold 256 sectors of information normally stored on the tracks of an electro-mechanical hard disk drive. Thus, a thirty chip flash array with sixteen individually-erasable subblocks per chip holds about the same amount of data as does a thirty megabyte electro-mechanical hard disk. As may be seen in FIG. 2, the individual blocks 23 of a chip 21 are further associated into groups of four blocks 24. The memory transistors of all of the four blocks are accessed using the same row conductors (wordlines). For example, the transistors of the first (0) row of each of the four blocks are all accessed by the same row conductor 26. Each column of each block is, on the other hand, accessed by a column conductor 28 individual to that column and that block 23 of the array 24.

Figure 3:
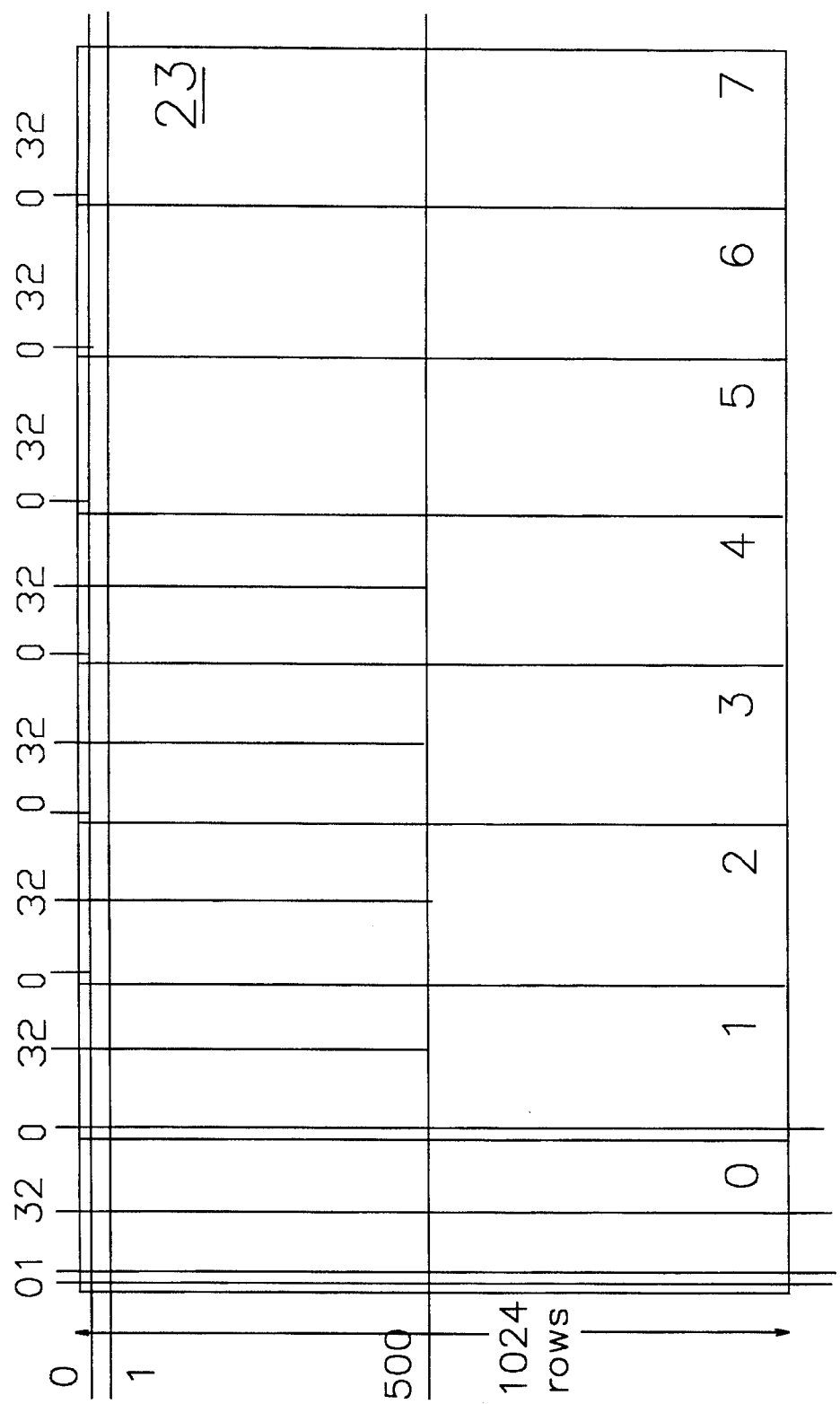
FIG. 3 is a diagram illustrating the arrangement of individual memory cells on a single block of a flash EEPROM memory array.

FIG. 3 illustrates the arrangement of memory transistors on an individual block 23 of the flash EEPROM array 24 illustrated in FIG. 2. As may be seen, the block 23 is divided into eight columnar areas labeled 0 through 7. In each columnar area are positioned 1024 rows and sixty-four columns of memory transistors (cells). Thus a block includes 1024 rows and 512 columns (8×64). As mentioned above, each block 23 is actually a subblock which stores one byte of data in a system organized with two byte words; the other byte is stored in another paired subblock on another chip 21. Data is typically stored in a block so that one bit of each byte is stored in each columnar area 0–7. Thus, a byte stored in the row shown as zero in FIG. 3 may have its first (0) bit positioned in any of sixty-four different columns within the columnar area (0). For example, the (0) bit of the byte may be positioned in the column labeled (0) in columnar area 0. The remainder of the bits of the byte will then be similarly positioned in the manner illustrated, each in the column labeled (0) of each of the remaining columnar areas 1–7. In this manner, by addressing the bit at row (0) and column (0) of the block, all of the bits of the byte are accessed simultaneously and may be read in parallel at output drivers (not shown) which will be joined for that operation to the columns (0) of all of the columnar areas 0–7 of the block.

As may be seen, this provides a total of 1024×64 byte addresses for the block. In association with a second subblock on a second chip 21, a total of 1024×64 word addresses exist for the logical block. Two of these addresses are illustrated. The address at row (0) and column (0) has already been described and is shown at the intersections of those conductors. Similarly, the byte addressed at row (500) and column (32) is illustrated at the intersections of those conductors.

Figure 4:
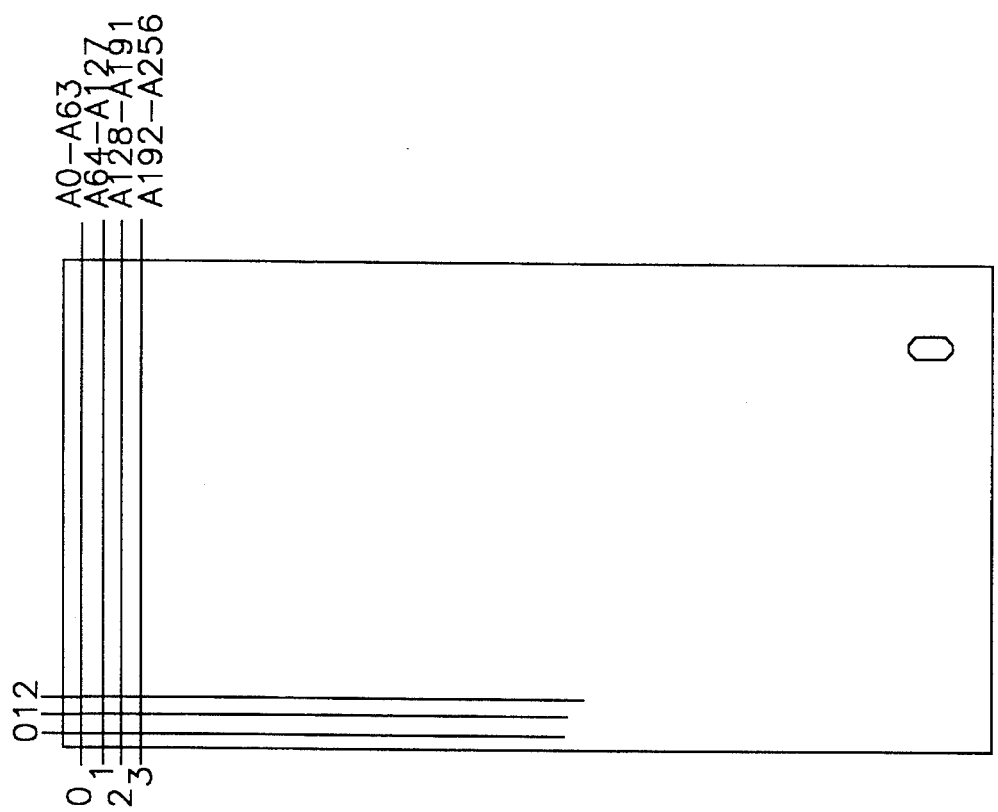
FIG. 4 is an enlarged diagram showing a portion of the arrangement of individual memory cells on a single block of a flash EEPROM memory array shown in FIG. 3 and illustrating one arrangement for storing data in an flash EEPROM.

FIG. 4 illustrates a portion of block 23 much enlarged over that shown in FIG. 3. Only a single one of the columnar areas (0) is shown. As is shown in FIG. 4, it is possible to store bytes of data in the block 23 of which the columnar area (0) is a portion beginning with row (0) and column (0) and progressing sequentially across the first row. Thus a first byte will have its first bit at address row (0) column (0), the next byte will have its first bit at row (0) column (1), the next byte will have its first bit at row (0) column (2), and so on until a particular amount of data is stored. This method of storage is referred to as "column first" because the column address is incremented through 64 columns before the row address changes. The most data that is stored at one time in one embodiment is equal to a typical sector of 512 bytes used by a electro-mechanical hard disk. If 512 bytes of data are stored together in the logical block, then half are stored in the subblock 23 illustrated in FIG. 3. It will be seen that the first bit of each byte included in a sector of information (of which 256 bytes are stored in the subblock 23 illustrated) will proceed sequentially through addresses in the first four rows of the columnar area (0), and similarly through the same positions of the columnar areas 1–7, from the address at row (0) column (0) to the address at row (3) column (63), a total of 256 addresses.

Using this storage scheme, if a single bit fails for some reason unrelated to the failure of a row or a column, then only that bit in that byte is affected. If, however, a row conductor fails, then all of the bits in a total of sixty-four bytes of data will fail since sixty-four bits lie on each row in each columnar area. Thus, a row failure will cause loss of one-sixteenth of the data stored in the sector. On the other hand, a column conductor runs through only a single columnar area in a single block so that it intersects only the top four rows of the columnar area (0). Thus, a column failure will cause the loss of only four bits of information (one bit in each of four bytes) using this scheme of storage.

Figure 5:
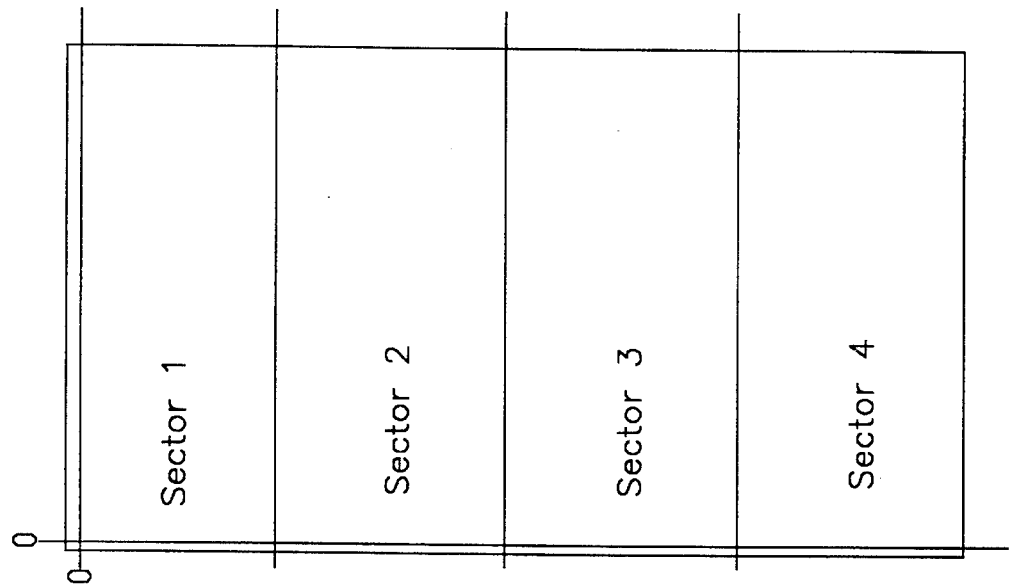
FIG. 5 is an enlarged diagram showing a portion of the arrangement of individual memory cells on a single block of a flash EEPROM array shown in FIG. 3 and illustrating another arrangement for storing data in an flash EEPROM.

FIG. 5 illustrates the same portion of a block 23 as is shown in FIG. 4. As is shown in FIG. 5, it is also possible to store bytes of data in the block 23 of which the columnar area (0) is a portion beginning with row (0) and column (0) and progressing sequentially downward through the memory transistors connected to the first column. Thus, a first byte will be at the address at row (0) column (0), the next at row (1) column (0), the next at row (2) column (0), and so on until a particular amount of data is stored. This method of addressing is referred to as "row first" because the row address is incremented through 1024 columns before the column address changes. Since the most data that is stored at one time in the preferred embodiment is equal to 512 bytes and only half of this is stored in each subblock, the first bit (0) of each byte of four sectors of data may be stored in a column of 1024 rows. Similarly, the bits 1–7 of the bytes may be stored in the same positions of the columnar areas 1–7, from the address at row (0) column (0) to the address at row (1024) column (0).

Using this storage scheme, if a single bit fails for some reason unrelated to the failure of a row or a column, then only that bit is affected as in the first scheme. If, however, a row conductor fails, then only one bit in a total of one byte of data will be lost since only one column of each of the eight columnar areas intersects any row conductor. Thus, a row failure will cause a loss of only one byte of the data stored in any sector. On the other hand, a column conductor connects to all of the memory transistors of all of the rows of each of four sectors of data in this storage arrangement. Thus, a column failure will cause the loss of one bit of information from each byte of all four sectors stored in that column of subblock 23. Consequently, all of the data in of the bytes of half of four sectors will be lost by a column failure using this scheme of storage.

Figures 6A, 6B, 7:
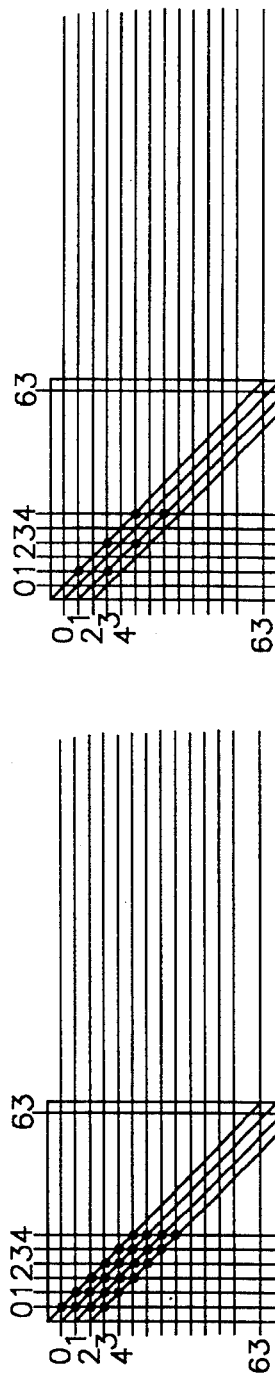
FIGS. 6A and 6B are enlarged diagrams showing a portion of the arrangement of individual memory cells on a single block of a flash EEPROM array shown in FIG. 3 and illustrating third and fourth arrangements for storing data in an flash EEPROM.
FIG. 7 illustrates an error correcting scheme which may be utilized with the storage arrangements shown in FIGS. 4, 5, and 6.

As mentioned above, it is possible to detect and correct certain errors using error detection and correction techniques. However, the techniques which function for the serially appearing bits of an electro-mechanical hard disk drive are not suitable for direct use with row and column arrays. FIG. 7 illustrates a simplistic method of error detection and correction which may be utilized for errors in the two storage arrangements described above. The method is illustrated to explain the problems associated with detecting and correcting errors in row and column organized memory arrays. For this purpose, only four rows and four columns of memory cell positions are shown. The method utilizes a parity checking arrangement in which each row and each column are assigned values depending on whether the total of one values stored in the particular row or column is an even or odd number. If the total of one values is odd as in the first, third, and fourth rows, a one is stored to bring the value to an even number. If the total is even as in the second, third, and fourth columns, a zero is stored so that the total remains an even number. These error checking bits are typically stored in the sector with the data as the data is written. In the preferred embodiment of the invention, seven bytes of this type of error checking and correcting data are stored. When the data is read from the sector, the parity check bits may be checked against the values of the data read. It will be seen that if a single bit error has occurred, the parity bits for a single column and a single row will not match the total of the values read. For example, if the one value stored at the intersection of the third row and the third column is read as a zero, then the parity value for the row will be zero while the stored parity bit for the row is one; and the parity value for the column will be one while the stored parity bit is a zero. These two failures during an error checking comparison show that the bit at the intersection is incorrect and allow that bit to be corrected to the proper one value.

As may be seen from FIG. 7, it is also possible with the simple parity checking error correction and detection scheme illustrated to detect multiple errors which occur in a single row and multiple errors which occur in different rows. It may be possible to correct some of these errors, but others will be uncorrectable with the scheme illustrated. For example, if two bits fail in the third column, each of the rows in which the bits fail will exhibit an incorrect parity bit while the column will have the correct parity bit. Consequently, even though it is clear that errors have occurred in particular rows, it is not known which bits in the rows are in error so a correction cannot be made with this simple scheme.

Various more complicated error detecting and correcting schemes are available, and such schemes will go much further in detecting and correcting errors. In fact, it is expected that at least one embodiment of the present invention will be used in a system in which single bit errors and single column and row errors can be both detected and corrected. Although it is expected that more complicated error detection and correction schemes would be used with the present invention, such schemes are not a part of this invention and, therefore, are not discussed further. Details of error detection and correction schemes are well known to those skilled in the art. Examples of error correcting code and the operation such code performs are detailed, for example, in *Practical Error Correction Design For Engineers*, Revised 2d Edition, Glover and Trent, published by Cirrus Logic Press, copyright 1990.

FIG. 6 illustrates the same portion of a block 23 as is shown in FIG. 3. FIG. 6 illustrates an arrangement for storing data in a memory array such as a flash EEPROM array which is accessed on a row and column basis in order to optimally isolate the largest amount of data stored from errors caused by faults in row and column conductors. As is shown in FIG. 6, it is also possible to store bytes of data in the block 23 of which the columnar area (0) is a portion beginning with row (0) and column (0) and progressing downward through the memory transistors in a diagonal pattern beginning at the upper left-hand corner of the columnar area of the block. As may be seen, the pattern of storage described is one in which the bits of each sequential byte of data are stored in a diagonal direction from bits of the immediately preceding byte. Since a typical block of data includes 64 columns of 1024 rows, four diagonal rows proceeding downwardly across the columnar areas of a block will store an amount of data equivalent to a sector of data. However, in contrast to storing data in the patterns illustrated in FIGS. 4 and 5, in the diagonal pattern shown in FIG. 6, if one column conductor fails, a total of four bits are lost while if one row conductor fails, a total of at most four bits are lost. Thus, as compared to other methods of storage, the diagonal pattern experiences the least data loss in any case of a wordline or bitline failure.

In order to provide a diagonal pattern of storage in the columnar area (0), the preferred pattern begins at row (0) column (0), moves to row (1) column (1), then to row (2) column (2), then to row (3) column (3), and continues diagonally across the columnar area (0) to row (63) column (63). Then the pattern moves back to row (1) column (0) and continues through three more adjacent diagonal patterns of storage positions in a repeating pattern which stores a sufficient amount of data to complete a sector of storage area. As is illustrated with respect to the columnar area (0), the bits 1–7 of the bytes will be stored in the same positions of the columnar areas 1–7, from address row (0) column (0) to address row (63) column (63). Thus each subblock 23 may store a half of one sector of data in four adjacent diagonal rows of each columnar area (0–7) each of which rows is 64 bits wide.

Using this storage scheme, if a single bit fails for some reason unrelated to the failure of a row or a column, then only that bit is affected (as in the first and second storage schemes illustrated in FIGS. 4 and 5). If, however, a row conductor fails, then bits in a total of four bytes of data will be lost since only four columns of each of the eight columnar areas intersects any row conductor. Thus, a row failure will cause at most the loss of fours byte of the data stored in any sector. On the other hand, any column conductor intersects only four bits of any sector which might be stored in this storage arrangement. Thus, a column failure will cause the loss of only the four bits of information in four bytes stored in that column. Thus, it may be seen that a diagonal storage pattern provides the least number of errors for either row or column failures.

It should be noted that other diagonal patterns may be utilized to provide similar advantages. For example, one diagonal pattern might move from the upper left corner of each of the columnar areas to the lower right corner by sequentially addressing the first four rows (0–3) in column (0), then the next four rows (4–7) in column (1) and so on. Other patterns will occur to those skilled in the art after studying the present invention.

Although the arrangement for storage by which a diagonal pattern is obtained provides the least number of errors in the case of either row or column failures in the array, the arrangement is also readily adaptable to use with error detection and correction schemes such as that outlined above in FIG. 7. In fact, since a much smaller number of errors can occur using the arrangement of diagonal storage, the error detection and correction systems may be made to include much less circuitry yet still operate much more efficiently.

Figure 8:
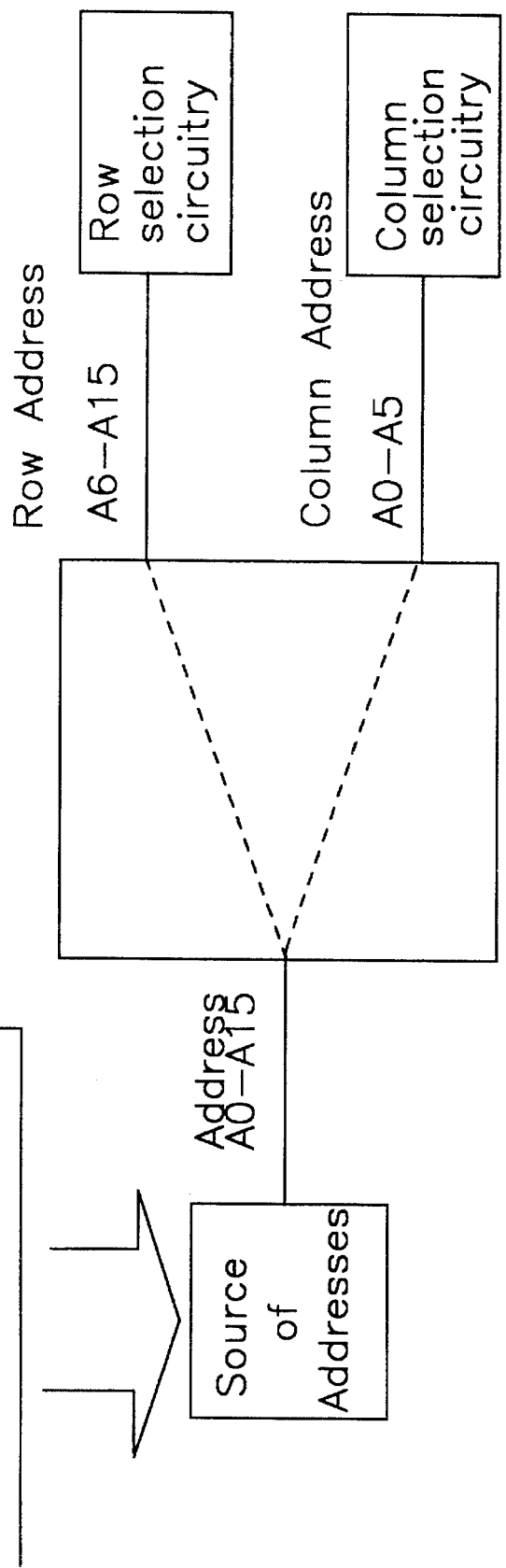
FIG. 8 illustrates a typical arrangements for addressing the rows and columns of a memory array such as flash EEPROM.

FIG. 8 illustrates a typical arrangement for addressing a memory array organized on a row and column basis. As may be seen in FIG. 8, an address is furnished to an address decoder circuit 70 in parallel on a plurality of address lines. In the example, sixteen address lines A0–A15 are illustrated. The decoder circuit 70 separates the address data into an initial six bits A0–A5 which designate the column address and ten bits A6–A15 which designate the row address. In order to access a particular address, either the row or column portion of the address (or both) may be varied. For example, to write sequential words of data to the first (0) row of the particular array in a column first addressing scheme, the sequential addresses change by incrementing the column bits by a binary one value with each sequential address while the row address bits all remain zero throughout the pattern. This writes data to the address at row (0) column (0), row (0) column (1), row (0) column (2), and so on until the pattern is complete. Similarly, to write sequential words of data to the first (0) column of the particular array in a row first addressing scheme, the sequential addresses change by incrementing the row bits by a binary one value with each sequential address while the column address bits all remain zero throughout the pattern. To provide an exact diagonal pattern, both the row and the column address increment by a binary one value with each succeeding word of the data.

Figure 9:
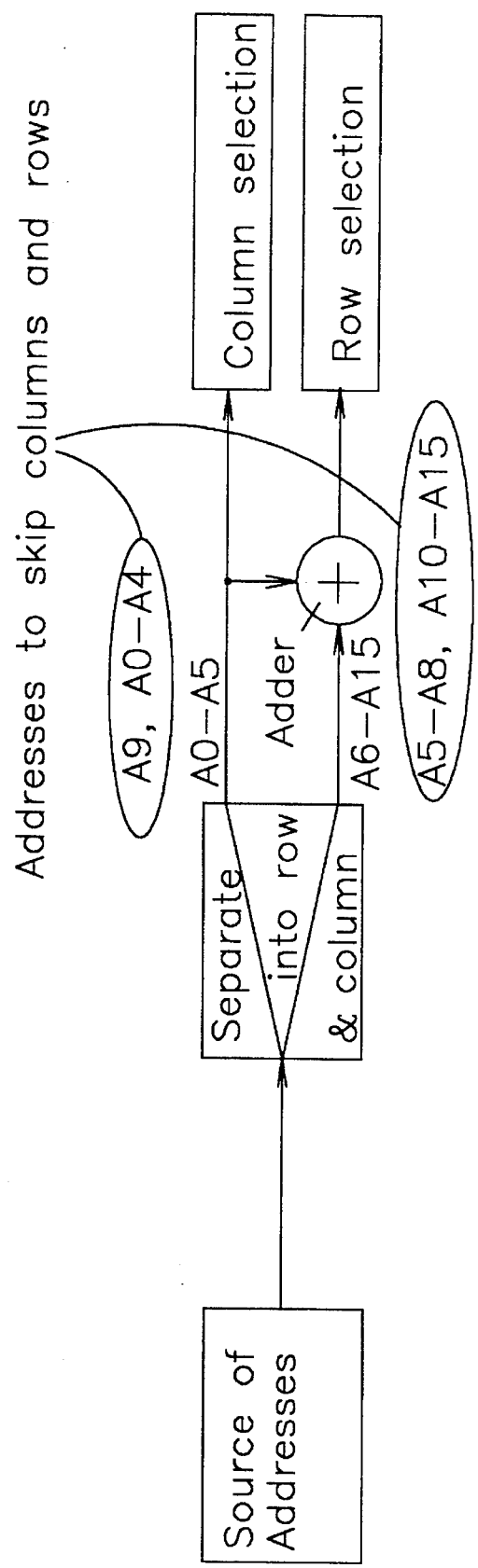
FIG. 9 illustrates circuitry which may be utilized to address a flash EEPROM storing data in the manner illustrated in FIG. 6.

FIG. 9 illustrates a circuit for providing a diagonal pattern such as is illustrated in FIG. 6. As will be seen, the row address portion of the address which includes the lowest order bits of the address is furnished first to the row decoder. The addresses are furnished in the normal sequential order described above. At the same time, the column address portion of the address which includes the higher valued bits is transferred to the column decoder in the normal fashion for sequential column first transfer. In the normal column first pattern, the row address only changes after each of the columns in a row has been accessed. However, the lowest order bits are also transferred simultaneously to an adder which adds the row and column bits for each column address. Since the row would not normally be changing, the addition of the column address bits to the row address causes the row address to change in the same pattern as the column address thereby producing a diagonal pattern. As will be seen, the diagonal pattern repeats after it has reached the last column of each row beginning with the next row succeeding the row at which the last diagonal pattern began.

The arrangement illustrated in FIG. 9 may be implemented by utilizing twos complement adders for adding the row and column portions of the addresses provided by the standard column first address decoders to generate the addresses for each of the row and column positions at each bit position of the block. The particular adder utilized will depend on the speed desired by the implementation. For example, for low performance arrays, a ripple carry type of twos complement adder may suffice while for higher performance arrays, a carry look ahead adder may be necessary. Whatever type of twos complement adder is selected, the carryout bit provided by such an adder is not used.

Figure 10:
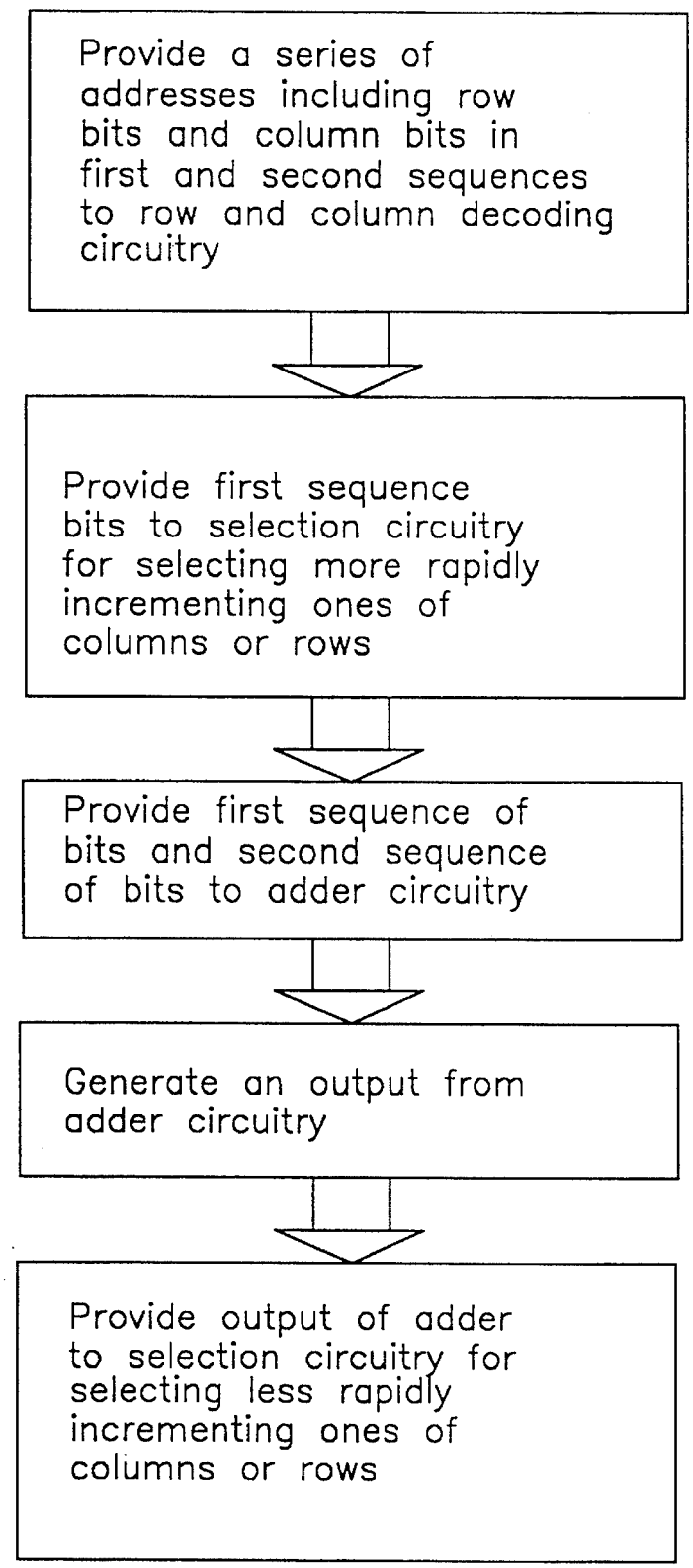
FIG. 10 is a flow chart illustrating a method for practicing a process in accordance with the present invention.

As may be seen in FIG. 10, the arrangement of FIG. 9 provides a process for providing addresses for storing data in a row and column oriented memory array in accordance with FIG. 6 by which the least number of memory cells are affected by a failure of either a row conductor or a column conductor. The process includes a first step of providing a series of sequential addresses to column and row decoding circuitry, each of the addresses having a first sequence of bits for designating a first address of either row or column addresses and a second sequence of bits for designating a second address of row or column addresses not designated by the first address, the bits of the first sequence of bits in the series of sequential addresses being adapted to increment addresses more rapidly than the bits of the second sequence of bits. It will be recognized that this is the normal manner of presenting addresses in column first or row first addressing.

Then whichever of the sequences of bits is incrementing more rapidly (row or column) is provided to selection circuitry for selecting a first address to be accessed (either the row or the column). This same sequence of bits which is incrementing more rapidly is also provided to adder circuitry for adding the bits of the column address and the bits of the row address and providing a new sequence resulting from the addition as an output value. That output value is then furnished to selection circuitry for selecting a second address to be accessed. In this manner a particular pattern of diagonal addresses is selected to accomplish the desired object or reducing the effect of row and common failures in a flash EEPROM memory array.

FIG. 9 also illustrates a second sequence of address bits which may be furnished in order to provide a diagonal pattern of storage in which a the bits of sequential bytes are stored in every other row and column of the diagonal. By furnishing an additional first bit beginning the column address in front of the column address bits provided by the normal address decoding, the column address is essentially multiplied by two causing the diagonal pattern of storage to skip every other column and every other row in the manner shown in FIG. 8B. A zero value as the beginning column bit is provided by furnishing the A9 bit which is the least significant constant bit associated with a sector transfer. The pattern may be made to skip three columns and rows by adding a second zero valued bit at the beginning of the column address which might be furnished by a second row address bit. Other patterns may be provided by other bit selections from the address provided as those skilled in the art will appreciate. The advantage offered by such a pattern is that when the pattern skips every other row and column, then an error in two adjacent columns or in two adjacent rows (which might occur for various reasons including some manufacturing problem) may be detected and corrected by error detection and correction circuitry. The scheme also allows the easy use of redundant memory circuitry during testing so that an operating chip may be furnished by a manufacturer.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for storing data in a row and column oriented memory array by which the least number of memory cells are affected by a failure of either a row conductor or a column conductor, comprising the steps of:

providing a series of sequential addresses to column and row decoding circuitry, each of the addresses having a first sequence of bits for designating a first of either row or column addresses and a second sequence of bits for designating a second of either row or column addresses not designated by the first address, the bits of the first sequence of bits in the series of sequential addresses being adapted to increment addresses more rapidly than the bits of the second sequence of bits, providing the first sequence of bits to selection circuitry for selecting a first of either row or column addresses to be accessed, providing the first sequence of bits and the second sequence of bits to adder circuitry for adding the bits of a column address and the bits of a row address for providing an output value, providing the output value to selection circuitry for selecting a second of either row or column addresses to be accessed.

2. Apparatus for accessing a row and column oriented memory array comprising:

means for providing a series of sequential addresses at which data is to be accessed, means for dividing each of the addresses provided into row and column addresses, and means for selecting positions to be accessed to produce a generally-diagonal storage pattern based on the row and column addresses.

3. Apparatus for accessing a row and column oriented memory array as claimed in claim 2 in which the means for selecting positions to be accessed to produce a generally-diagonal storage pattern based on the row and column addresses comprises:

means for providing a more rapidly incrementing one of the row or column addresses to circuitry for selecting the particular one of the row or the column address, means for adding the bits of the row and the column addresses to obtain a value, and means for providing the value to circuitry for selecting the other of the column or row address.

4. Apparatus for accessing a row and column oriented memory array as claimed in claim 3 in which the means for adding the bits of the row and the column addresses to obtain a value comprises a twos complement adder circuit.

5. Apparatus for accessing a row and column oriented memory array as claimed in claim 4 in which the twos complement adder circuit is a ripple carry adder.

6. Apparatus for accessing a row and column oriented memory array as claimed in claim 4 in which the twos complement adder circuit is a carry look ahead adder.

7. A computer system comprising:

central processor means;

means for providing storage for data comprising
memory array means organized on a row and column basis,
means for accessing the memory array means comprising:
means for providing a series of sequential addresses in the memory array means at which data is to be accessed,
decoding means for separating the addresses provided into row and column addresses, and
means for selecting positions to be accessed to produce a generally-diagonal storage pattern based on the row and column addresses; and system busing means for transferring data and addresses between the central processor means and the means for providing storage of data.

8. A computer system as claimed in claim 7 in which the means for selecting positions to be accessed to produce a generally-diagonal storage pattern based on the row and column addresses comprises:

means for providing a more rapidly incrementing one of the row or column addresses to circuitry for selecting the particular one of the row or the column address, means for adding the bits of the row and the column addresses to obtain a value, and means for providing the value to circuitry for selecting the other of the column or row address.

9. A computer system as claimed in claim 8 in which the means for adding the bits of the row and the column addresses to obtain a value comprises a twos complement adder circuit.

10. A computer system as claimed in claim 9 in which the twos complement adder circuit is a ripple carry adder.

11. A computer system as claimed in claim 9 in which the twos complement adder circuit is a carry look ahead adder.

12. A computer system as claimed in claim 7 in which the memory array means organized on a row and column basis is a flash EEPROM memory array including a plurality of floating gate field effect transistor devices.

13. Apparatus for accessing a row and column oriented memory array comprising:

a source of sequential addresses at which data is to be accessed, circuitry for separating the addresses provided into row and column addresses, and circuitry for selecting positions to be accessed to produce a generally-diagonal storage pattern based on the row and column addresses.

14. Apparatus for accessing a row and column oriented memory array as claimed in claim 13 in which the circuitry for selecting positions to be accessed to produce a generally-diagonal storage pattern based on the row and column addresses comprises:

circuitry for providing a more rapidly incrementing one of the row or column addresses to circuitry for selecting the particular one of the row or the column address, an adder for adding bits of the row and the column addresses to obtain a value, and circuitry for providing the value to circuitry for selecting the other of the column or row address.

15. Apparatus for accessing a row and column oriented memory array as claimed in claim 14 further comprising:

circuitry for providing one or more additional bits before the lowest valued bits of the more rapidly incrementing one of the row or column addresses to circuitry for selecting the particular one of the row or the column address.

16. Apparatus for accessing a row and column oriented memory array as claimed in claim 14 in which the adder for adding bits of the row and the column addresses to obtain a value comprises a twos complement adder circuit.

17. Apparatus for accessing a row and column oriented memory array as claimed in claim 16 in which the twos complement adder circuit is a ripple carry adder.

18. Apparatus for accessing a row and column oriented memory array as claimed in claim 16 in which the twos complement adder circuit is a carry look ahead adder.

19. A computer system comprising:

a central processor;

a data storage array organized on a row and column basis comprising:

a source of a series of sequential addresses in the memory array at which data is to be accessed, decoding circuitry for separating the addresses provided into row and column addresses, and circuitry operating in response to the row and column addresses for selecting positions to be accessed to produce a generally-diagonal storage pattern; and a system bus for transferring data and addresses between the central processor and the data storage array.

20. A computer system as claimed in claim 19 in which the circuitry operating in response to the row and column addresses for selecting positions to be accessed to produce a generally-diagonal storage pattern comprises:

circuitry for transferring a more rapidly incrementing one of the row or column addresses to circuitry for selecting the particular one of the row or the column address, circuitry for adding the bits of the row and the column addresses to obtain a value, and circuitry for providing the value to circuitry for selecting the other of the column or row address.

21. A computer system as claimed in claim 20 further comprising:

circuitry for providing one or more additional bits before the lowest valued bits of the more rapidly incrementing one of the row or column addresses to circuitry for selecting the particular one of the row or the column address.

22. A computer system as claimed in claim 20 in which the circuitry for adding the bits of the row and the column addresses to obtain a value comprises a twos complement adder circuit.

* * * * *